United States Patent [19]

Endou

[11] Patent Number: 4,628,148
[45] Date of Patent: Dec. 9, 1986

[54] ENCAPSULATED ELECTRONIC CIRCUIT

[75] Inventor: Kunihisa Endou, Kawagoe, Japan

[73] Assignee: Toko, Inc., Tokyo, Japan

[21] Appl. No.: 715,177

[22] Filed: Mar. 20, 1985

[30] Foreign Application Priority Data

Mar. 27, 1984 [JP] Japan .............................. 59-43929[U]
Mar. 27, 1984 [JP] Japan .............................. 59-43930[U]

[51] Int. Cl.$^4$ ............................................. H01F 27/02
[52] U.S. Cl. ............................ 174/52 PE; 174/52 FP;
336/96; 361/410
[58] Field of Search ................... 174/52 PE, 52 FP;
357/74, 72; 361/404, 405, 406, 409, 410; 339/17
C, 17 CF, 17 LC; 336/65, 96, 192; 264/272.19,
273, 274

[56] References Cited

U.S. PATENT DOCUMENTS

| 3,493,908 | 2/1970 | Byers et al. | 174/52 PE X |
| 3,721,747 | 3/1973 | Renskers | 336/96 X |
| 4,506,238 | 3/1985 | Endoh et al. | 361/404 X |
| 4,542,260 | 9/1985 | Pearce | 174/52 PE |

Primary Examiner—Arthur T. Grimley
Assistant Examiner—D. A. Tone

[57] ABSTRACT

In a miniaturized electronic component device, a component body including at least one coil is entirely embedded in a protecting elastic body, with leads of the component body being led out through the protecting elastic body; the latter is coupled to a base plate; external terminals are attached to the side portions of the base plate and electrically connected to the leads of the component body; and encapsulation is provided surrounding the base plate and protecting elastic body, with the free end portion of each of the external terminals being exposed through the encapsulation.

7 Claims, 11 Drawing Figures

FIG. I
PRIOR ART
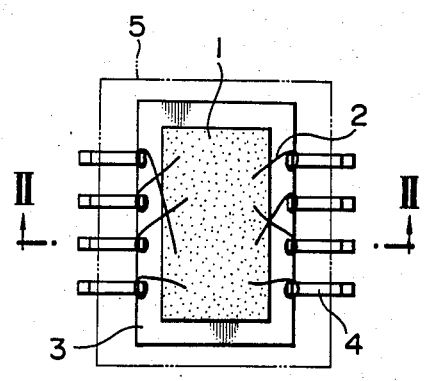
FIG. 2
PRIOR ART
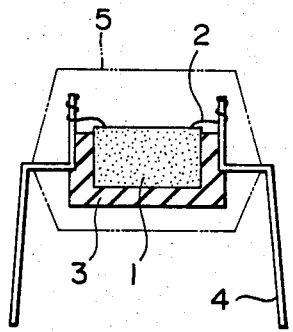
FIG. 3
PRIOR ART
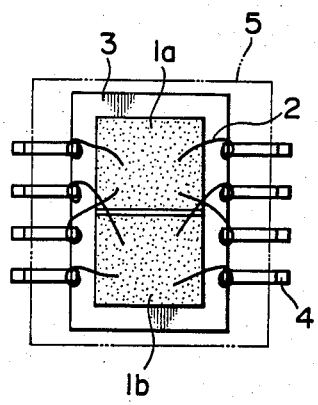
FIG. 4
PRIOR ART
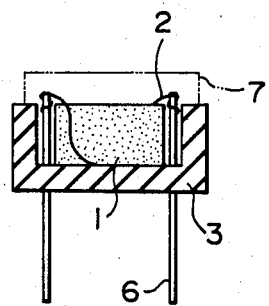

ENCAPSULATED ELECTRONIC CIRCUIT

BACKGROUND OF THE INVENTION

1. Field of the Invention

This invention relates to a miniaturized electronic component device such as pulse transformer, wide-band transformer, delay line circuit device or the like, which comprises a component body including at least one coil, and external terminals having the leads of said at least one coil connected thereto.

2. Description of the Prior Art

In order to have a better understanding of the present invention, description will first be made of conventional electronic component devices of this type with reference to FIGS. 1 to 4 of the accompanying drawings. FIG. 1 shows, in a plan view, an example of the conventional electronic component devices, with the encapsulation thereof being omitted. FIG. 2 is a sectional view taken along the lines II—II of FIG. 1.

The conventional electronic component device shown in FIGS. 1 and 2 comprises a component body including at least one coil, though not shown. The component body is entirely embedded in a protecting elastic body 1 which is formed of silicone rubber or the like. The leads 2 of the coil are led out through the protecting elastic body 1. The component body entirely embedded in the protecting elastic body 1 is accommodated in an insulating case 3 which is opened at the top face thereof. External terminals 4 are attached to the opposite side walls of the insulating case 3, and have their upper ends project out of the top margin of the insulating case 3. The leads 2 of the coil are wound and soldered onto the upper ends of the external terminals 4 to be electrically connected thereto. The insulating case 3 is encapsulated with an insulating resin material as shown by an alternate long and short dash line 5 in such a manner that the free end portion of each of the external terminals 4 is exposed through the encapsulation.

FIG. 3 shows, in a plan view, another example of the conventional electronic component devices, which comprises two separate component bodies embedded in protecting elastic bodies as indicated at 1a and 1b respectively and accommodated in an insulating case 3.

FIG. 4 shows, in a sectional view, still another example of the conventional electronic component devices, wherein straight external terminals 6 are attached in such a manner as to extend through the bottom wall of an insulating case 3 which is opened at the top face thereof; leads 2 are wound and soldered onto the upper end portions of the external terminals 6; and encapsulation is provided covering only the top face of the insulating case 3 and the upper end portions of the external terminals 6, as shown by an alternate long and short dash line 7.

However, the above-mentioned conventional electronic component devices are disadvantageous in the following points:

Firstly, the packing volume is small for the reason that since the external terminals 4 or 6 are securely attached to the wall of the insulating case 3 accommodating the component body embedded in the protecting elastic body 1, the wall thickness of the insulating case 3 should be increased to enhance the strength of the insulating case 3 so that the insulating case 3 has only a limited accommodation capacity.

Secondly, automatic assembling is difficult to achieve for the reason that the connection of the leads 2 of the component body to the external terminals 4 or 6 is effected by winding the free end portions of the leads 2 onto the upper end portions of the external terminals 4 or 6.

Thirdly, in the case where the number of the leads 2 led out of the component body is large, the leads 2 are connected to the external terminals 4 or 6 while crossing each other. Thus, there is a possibility that the leads 2 may be shorted or cut off during the assembling operation. This makes it more difficult to achieve automatic assembling. Especially, in the case where plural component bodies are accommodated in the single case 3 as shown in FIG. 3, there is an increased possibility that the leads 2 may cross each other, so that the leads 2 are more liable to be shorted or cut off.

SUMMARY OF THE INVENTION

Accordingly, it is an object of the present invention to provide a novel and improved electronic component device which is miniaturized and yet has an increased packing volume.

Another object of the present invention is to provide an electronic component device which is adapted for automatic assembling by virtue of such construction that the leads can be connected to the external terminals without being wound thereonto.

Still another object of the present invention is to provide an electronic component device which is so designed that the leads can be connected to the external terminals without crossing each other, thereby precluding a possibility that the leads may be shorted or cut off during the assembling operation.

According to an aspect of the present invention, a component body which includes at least one coil is entirely embedded in a protecting elastic body, with the leads of the coil being led out through the protecting elastic body, and mechanically coupled to and held by a base plate. The mechanical coupling between the protecting elastic body and the base plate is achieved through engagement of coupling means provided on the protecting elastic body and base plate respectively. External terminals are attached to the side portions of the base plate and electrically connected to the leads; and encapsulation is provided surrounding the base plate and protecting elastic body, with the free end portions of the external terminals being exposed through the encapsulation.

Other objects, features and advantages of the present invention will become apparent from the ensuing description taken in conjunction with the accompanying drawings.

BRIEF DESCRIPTION OF THE DRAWINGS

FIG. 1 is a top plan view of a conventional electronic component device.

FIG. 2 is a sectional side view taken along the line II—II of FIG. 1.

FIG. 3 is a top plan view showing another conventional electronic component device.

FIG. 4 is a sectional side view showing still another conventional electronic component device.

DESCRIPTION OF THE PREFERRED EMBODIMENTS

Figure 5:
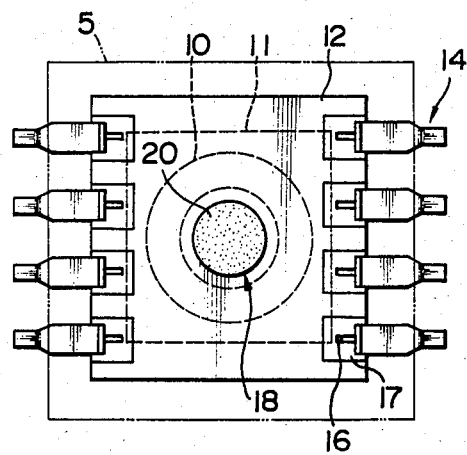
FIG. 5 is a top plan view showing the electronic component device according to an embodiment of the present invention.
Figure 6:
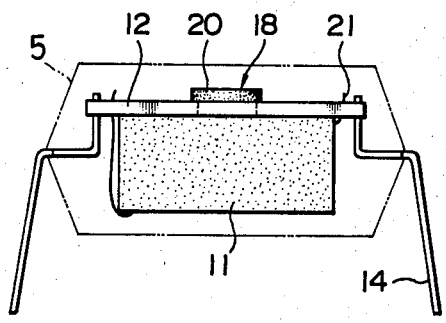
FIG. 6 is a side view of the device shown in FIG. 5.
Figure 7:
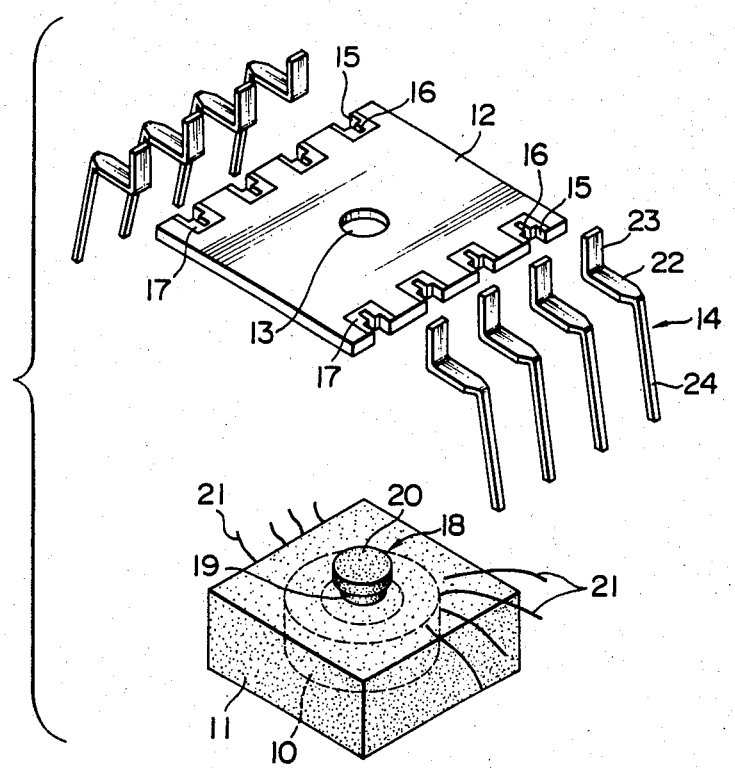
FIG. 7 is an exploded perspective view of the device shown in FIG. 5.

Referring to FIGS. 5 to 7 of the drawings, there is illustrated a pulse transformer embodying the present invention. FIG. 5 is a plan view showing the pulse transformer with the encapsulation thereof being omitted, which is indicated by an alternate long and short dash line 5; FIG. 6 is a front view thereof; and FIG. 7 is an exploded perspective view thereof.

The pulse transformer 10, which comprises coils wound on a toroidal core, is entirely embedded in a protecting elastic body 11 of silicone rubber and mounted onto the bottom face of a base plate 12. The base plate 12 is made of an insulating resin or ceramics and has a through-aperture 13 formed at the center thereof. Furthermore, the base plate 12 has four recesses 15 formed in each of the two opposite side portions thereof. External terminals 14 are fitted in the recesses 15 respectively. Also formed in the base plate 12 are grooves 16 which extend inwardly and are in communication with the respective recesses 15. A conductor pattern 17 is provided around each recess and groove.

The protecting elastic body 11 in which the pulse transformer 10 is entirely embedded as mentioned above, is configured in the form of a rectangular parallelepiped and provided with an engagement protrusion 18 at the center of the top surface thereof. The engagement protrusion 18 comprises a cylindrical neck portion 19, the outer diameter of which is substantially equal to the inner diameter of the through-aperture 13 formed in the base plate 12; and a flange portion 20 provided at the top end of the neck portion 19. By pushing the engagement protrusion 18 into the through-aperture 13 while deforming the flange portion 20, the latter will be caused to appear at the top surface of the base plate 12 and then returned to its original configuration so that the protecting elastic body 11 will be securely attached to the bottom surface of the base plate 12. In this case, a bonding agent may be applied to the top surface of the elastic protecting body 11 and the bottom surface of the base plate 12 to cause the protecting elastic body 11 and base plate 12 to be bonded together.

Leads 21 of the pulse transformer 10 are led out through the protecting elastic body 11, and inserted into the respective grooves 16 of the base plate 12 after the protecting elastic body 11 has been attached to the bottom surface of the base plate 12 as mentioned above.

Each of the external terminals 14 comprises three portions, i.e., a horizontal or lateral portion 22; an upwardly-bent end portion 23 provided at one end of the horizontal portion 22; and a downwardly-bent end portion 24 provided at the other end of the horizontal portion 22. The upwardly-bent end portions 23 are fitted in the recesses 15 and then electrically connected to the conductor patterns 17, together with the leads 21 inserted into the grooves 16, respectively. Such connection may be carried out by soldering or welding. In this way, the leads 21 are connected to the external terminals 14, respectively. After this connection has been established, the pulse transformer 10 is encapsulated in the form of a dual in-line package as indicated by the alternate long and short dash line 5 in FIGS. 5 and 6, with the downwardly-bent end portions 24 of the external terminals 14 being exposed through the encapsulation.

Figure 8:
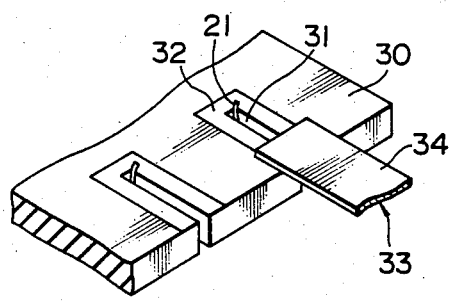
FIG. 8 is an enlarged fragmentary perspective view showing the base plate and external terminal of the electronic component device according to another embodiment of the present invention.

FIG. 8 illustrates, in an enlarged view, the manner in which external terminals are connected to a base plate in a second embodiment of the present invention. According to this embodiment, no recesses in which the external terminals are to be fitted, are formed in the side portions of the base plate 30. That is, the base plate 30 is only formed with grooves 31 through which the lead wires 21 are to be inserted, and conductor patterns 32 are provided around the grooves. The external terminals 33 are provided with no upwardly-bent end portions and have their horizontal portions 34 connected to the conductor patterns 32 by means of soldering or the like, respectively.

Figure 9:
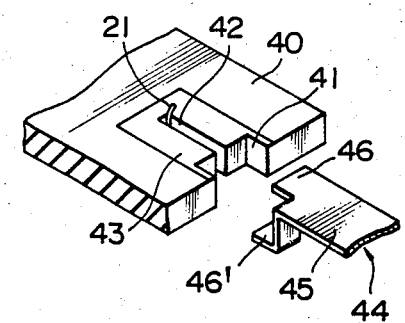
FIG. 9 is an enlarged fragmentary perspective view showing the base plate and external terminal of the electronic component device according to still another embodiment of the present invention.

FIG. 9 illustrates, in an enlarged view, the manner in which external terminals are connected to a base plate in a third embodiment of the present invention. According to this embodiment, the base plate 40 is formed with recesses 41 and grooves 42, and conductor patterns 43 are provided thereon in such a manner as to surround the recesses and grooves as in the embodiment shown in FIGS. 5 to 7. Each of the external terminals 44 includes a horizontal portion 45 which has a stepped portion 46' and a non-stepped portion 46 provided at the front end portion thereof. The portions 46 and 46' are fitted in the recesses 41 to hold the base plate 40 therebetween so that the external terminals 44 are securely attached to the base plate 40 and electrically connected to the conductor patterns 43, together with the leads 21, respectively.

Figure 10:
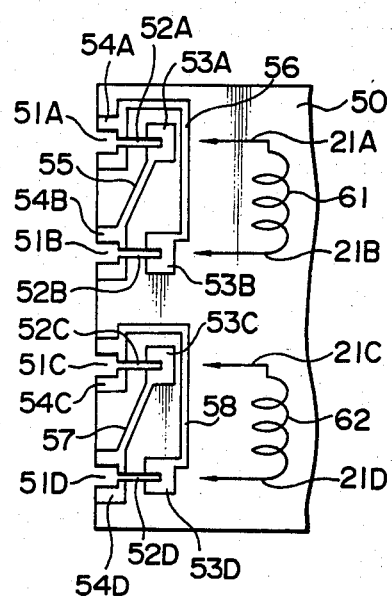
FIG. 10 is a fragmentary top plan view showing the base plate of the electronic component device according to a further embodiment of the present invention.

FIG. 10 illustrates conductor patterns provided on the side portions of a base plate in a fourth embodiment of the present invention. As in the embodiment shown in FIGS. 5 to 7, four recesses 51A to 51D and four grooves 52A to 52D in communication therewith are formed in each side portion of the base plate 50. External terminals are fitted in the recesses 51A to 51D respectively, and leads are inserted through the grooves 52A to 52D respectively. However, this embodiment is different from the embodiment of FIGS. 5 to 7 in that in each set of recess and groove, conductor patterns provided therearound are separate from each other. The conductor pattern around each recess is not connected to the conductor pattern around the groove in communication with that recess but to the conductor pattern around the groove in communication with another recess. More specifically, the conductor pattern 53A around the groove 52A is connected to the conductor pattern 54B through a conductor pattern 55; the conductor pattern 53B around the groove 52B is connected to the conductor pattern 54A around the recess 51A through a conductor pattern 56; the conductor pattern 53C around the groove 52C is connected to the conductor pattern 54D around the recess 51D through a conductor pattern 57; and the conductor pattern 53D around the groove 52D is connected to the conductor pattern 54C around the recess 51C through a conductor pattern 58.

Leads 21A and 21B of a coil 61, which is indicated by an equivalent symbol, are inserted through the grooves 52A and 52B respectively, and leads 21C and 21D of another coil 62, which is also shown by an equivalent symbol, are inserted through the grooves 52C and 52D respectively. Thus, the lead 21A is connected to the external terminal which is fitted in the recess 51B; the lead 21B is connected to the external terminal which is fitted in the recess 51A; the lead 21C is connected to the external terminal which is fitted in the recess 51D; and the lead 21D is connected to the external terminal which is fitted in the recess 51C.

Figure 11:
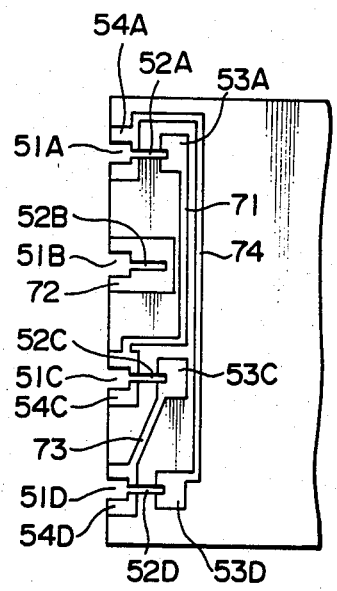
FIG. 11 is a fragmentary top plan view showing the base plate of the electronic component device according to a still further embodiment of the present invention.

Referring to FIG. 11, there are shown different conductor patterns from those shown in FIG. 10. In FIG. 11, the conductor pattern 53A around the groove 52A is connected to the conductor pattern 54C around the recess 51C through a conductor pattern 71; the recess 51B and groove 52B are surrounded by a continuous conductor pattern 72; the conductor pattern 53C around the groove 52C is connected to the conductor pattern 54D around the recess 51D through a conductor pattern 73; and the conductor pattern 53D around the groove 52D is connected to the conductor pattern 54A around the recess 51A through a conductor pattern 74.

With each of the conductor pattern arrangements shown in FIGS. 10 and 11, simply by inserting each lead through the nearest groove, it is possible to connect the lead to a desired one of the external terminals, irrespective of the position of the recess in which that external terminal is fitted. Thus, it is possible to prevent the leads from crossing each other during the assembling operation, thereby precluding a possibility that the leads may be shorted or cut off due to contact therebetween. Furthermore, even when according to the customer's specification, for example, the position where an external terminal is to be attached, is remote from the position where a lead is to be connected to the external terminal, the desired connection can be achieved with ease.

In the electronic component device according to the present invention, the protecting elastic body in which the component body is entirely embedded and the base plate holding the embedded component body are respectively provided with means for coupling them together as mentioned hereinabove, thereby eliminating the necessity to provide any case for accommodating the component body. Thus, according to the present invention, there is provided an electronic component device which is miniaturized and yet has an increased packing volume.

Furthermore, according to the present invention, the necessity to wind the leads of the component body onto the external terminals, is eliminated so that the assembling operation becomes easy and can be carried out on the basis of automation.

While the present invention has been described with respect to specific embodiments wherein the component body including at least one coil is a pulse transformer, it is to be understood that the present invention is by no means limited thereto but is equally applicable to any type of component body including at least one coil. It is also to be understood that the present invention encompasses all changes and modifications which will become possible within the scope of the appended claims.

What is claimed is:

1. An electronic component device comprising: a component body including at least one coil and having leads attached thereto; a protecting elastic body in which said component body is entirely embedded, the leads of said component body passing through said elastic body and outside thereof; a base plate having side portions; means for coupling said protecting elastic body and said base plate, said coupling means being provided on said protecting elastic body and on said base plate; external terminals attached to said side portions of said base plate and electrically connected to said leads; said external terminals having free end portions; and encapsulation means surrounding said base plate and said protecting elastic body; the free end portions of said external terminals extending outside said encapsulation.

2. An electronic component device according to claim 1, wherein said protecting elastic body is formed of silicone rubber.

3. An electronic component device according to claim 1, wherein said coupling means comprises a through-aperture formed in said base plate, and an engagement protrusion provided on said protecting elastic body and elastically engaging said through-aperture.

4. An electronic component device according to claim 1, wherein grooves are formed in said side portions of said base plate, said leads being inserted through said grooves; and first conductor patterns are provided around said grooves, said leads being electrically connected to said external terminals through said first conductor patterns.

5. An electronic component device according to claim 4, wherein recesses are formed in said side portions of said base plate, said external terminals being fitted in said recesses; said grooves being in communication with said recesses respectively; and second conductor patterns are provided around said recesses.

6. An electronic component device according to claim 5, wherein said first conductor pattern provided around each of said grooves is contiguous with said second conductor pattern provided around that one of said recesses which is in communication with said each groove.

7. An electronic component device according to claim 5, wherein said first conductor pattern provided around at least one of said grooves is separate from said second conductor pattern provided around that one of the recesses which is in communication with said groove and connected to the second conductor pattern provided around another one of said recesses through a third conductor pattern.

* * * * *